United States Patent [19]

Ohgami et al.

[11] Patent Number: 5,513,069

[45] Date of Patent: *Apr. 30, 1996

[54] ELECTRONIC APPARATUS WITH STORING PORTION INTO WHICH A DETACHABLE UNIT WITH A SLIDABLY ATTACHED UNIT HOLDER IS SLIDABLY CONNECTED

[75] Inventors: Keizo Ohgami; Kazuo Akashi, both of Tokyo, Japan

[73] Assignee: Kabushiki Kaisha Toshiba, Kawasaki, Japan

[ * ] Notice: the term of this patent shall not extend beyond the expiration date of Pat. No. 5,264,986.

[21] Appl. No.: 370,178

[22] Filed: Jan. 9, 1995

Related U.S. Application Data

[63] Continuation of Ser. No. 140,795, Oct. 21, 1993, Pat. No. 5,402,309, which is a continuation of Ser. No. 900,162, Jun. 17, 1992, Pat. No. 5,264,986.

[30] Foreign Application Priority Data

Jun. 17, 1991 [JP] Japan ..................... 3-144982

[51] Int. Cl.$^6$ ............... G06F 1/16; H05K 7/14; H05K 5/02
[52] U.S. Cl. ............ 361/685; 361/726; 361/740
[58] Field of Search ............ 364/708.1; 360/137; 439/476, 484, 928, 928.1, 76.1; 312/223.2; 361/683–686, 725–727, 740, 755, 759,801, 825; 16/115

[56] References Cited

U.S. PATENT DOCUMENTS

| | | |
|---|---|---|
| 4,466,679 | 8/1984 | St. Germain et al. .................. 439/476 |
| 4,858,162 | 8/1989 | Kieffer et al. ........................... 361/683 |
| 4,895,231 | 1/1990 | Yamaguchi et al. .................... 361/683 |
| 4,941,841 | 7/1990 | Darden et al. .......................... 361/685 |
| 4,991,058 | 2/1991 | Watkins et al. ......................... 361/683 |
| 5,011,198 | 4/1991 | Gruenberg et al. ....................... 292/41 |
| 5,095,405 | 3/1992 | Ishida . |
| 5,159,533 | 10/1992 | Kuang . |
| 5,264,986 | 11/1993 | Ohgami et al. ..................... 361/685 X |
| 5,402,309 | 3/1995 | Ohgami et al. ......................... 361/685 |

Primary Examiner—Michael W. Phillips
Attorney, Agent, or Firm—Limbach & Limbach; Alan S. Hodes

[57] ABSTRACT

An electronic apparatus includes a body including a storing portion and an engagement portion. A detachable unit is detachably stored in the storing portion. A unit holder holds the detachable unit in the storing portion, the unit holder being slidably connected to the detachable unit and including an engaging member movable between an engaging position and a release position. In the engaging position, the engaging member engages the engagement portion to hold the detachable unit in the storing portion. In the release position, the engaging member is disengaged from the engagement portion. An insertion opening may be provided in the storing portion of the body through which the detachable unit is detachably stored, and a cover may be provided to cover the insertion opening when the detachable unit is stored in the storing portion.

8 Claims, 7 Drawing Sheets

ELECTRONIC APPARATUS WITH STORING PORTION INTO WHICH A DETACHABLE UNIT WITH A SLIDABLY ATTACHED UNIT HOLDER IS SLIDABLY CONNECTED

This is a continuation of application Ser. No. 140,795 (filed Oct. 21, 1993; now U.S. Pat. No. 5,402,309 issued on Mar. 28, 1995) which is a continuation of application Ser. No. 900,162 (filed Jun. 17, 1992; now U.S. Pat. No. 5,264,986 issued on Nov. 23, 1993).

BACKGROUND OF THE INVENTION

1. Field of the Invention

The present invention relates to an electronic apparatus such as a lap-top type personal computer, and more particularly, to an electronic apparatus equipped with a detachable unit such as a hard disk drive (hereinafter referred to as HDD), a battery pack, and the like, which is detachable from the body of the device.

2. Description of the Related Art

Recently, portable electronic apparatuses such as so-called book-type and lap-top type personal computers are available. Some electronic apparatuses of this type have a structure to which, for example, a 2.5-inch HDD serving as a high-speed external memory of large capacity is attachable. This HDD is contained in a rectangular metal case, and the assembly of the HDD and case is called a HDD pack. Electrically connecting the HDD pack to a computer by mounting the pack in the body of the computer can remarkably increase the memory capacity thereof.

A conventional computer has a body provided with a mounting portion for mounting a HDD pack therein. The pack is inserted into the mounting portion, and then secured to a predetermined portion in the same with a plurality of screws screwed from the bottom side of the body.

However, in the computer with the HDD pack secured to its body with screws, the pack must be detached from or attached to the body by using a tool such as a driver, when the pack is replaced with a larger-capacity pack, or it is detached from the computer to lighten the same and facilitate its carriage, or it is detached to be used in another computer. Thus, it requires much time and labor to perform detachment and attachment of the pack.

Further, these days, in accordance with development of effective use of HDD media, and an increase in the capacity and versatility of a HDD pack, detachment and attachment of HDD packs have so often been performed. This being so, it is desired to provide a structure capable of easily detaching a HDD pack from a computer body and reliably holding the same in the body.

SUMMARY OF THE INVENTION

This invention has been made in consideration of the above circumstances, and its object is to provide an electronic device from which a detachable unit can be easily detached and in which it can be reliably held.

To attain the above object, an electronic apparatus according to the present invention comprises: a body having a storing portion provided with an insertion opening opened to the outside of the body and an engagement portion provided in the vicinity of the insertion opening; a detachable unit received in the storing portion and being detachable from the storing portion through the insertion opening; and a unit holder holding the hard disk drive holder in the storing portion. The unit has a retaining member movable between an engagement position in which the retaining member is engaged with the engagement portion of the body of the apparatus to hold the unit holder fitted in the insertion opening, and a retreat position in which the retaining member is disengaged from the engagement portion to allow the unit holder to be fitted in and detached from the insertion opening. The electronic apparatus further comprises a closing member for closing the insertion opening, having lock means for locking the retaining member in the engagement position.

In the thus-constructed electronic apparatus, the detachable unit is fitted into the storing portion of the body of the apparatus. At this time, the unit holder is fitted in the insertion opening of the body. Then, the retaining member is moved to the engagement position, where it engages with the engagement portion of the apparatus body. Subsequently, the closing member is fitted in the insertion opening, thereby closing the same and locking the retaining member in the engagement position with the use of its lock means. Thus, the unit holder is kept fitted in the insertion opening, and the detachable unit is fixed in the storing portion.

Taking the detachable unit out of the storing portion is performed in a manner reverse to the above. After the closing member is detached from the apparatus body, the retaining member is moved to the retreat position. Then, the unit holder is detached from the insertion opening, thereby taking the detachable unit, connected thereto, out of the storing portion.

Consequently, according to the invention, the detachable unit can be fixed in the storing portion of the body of the apparatus without using screws, i.e., it can be easily attached to or detached from the apparatus without using a tool such as a driver. Further, the unit holder can be kept fitted in the insertion opening by the closing member, and accordingly the detachable unit can be reliably held in a predetermined position in the storing portion.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIGS. 1 to 9 show a lap-top type personal computer according to an embodiment of the present invention, in which:

DETAILED DESCRIPTION OF THE PREFERRED EMBODIMENTS

An embodiment of the invention will be explained with reference to the accompanying drawings.

Figure 1:
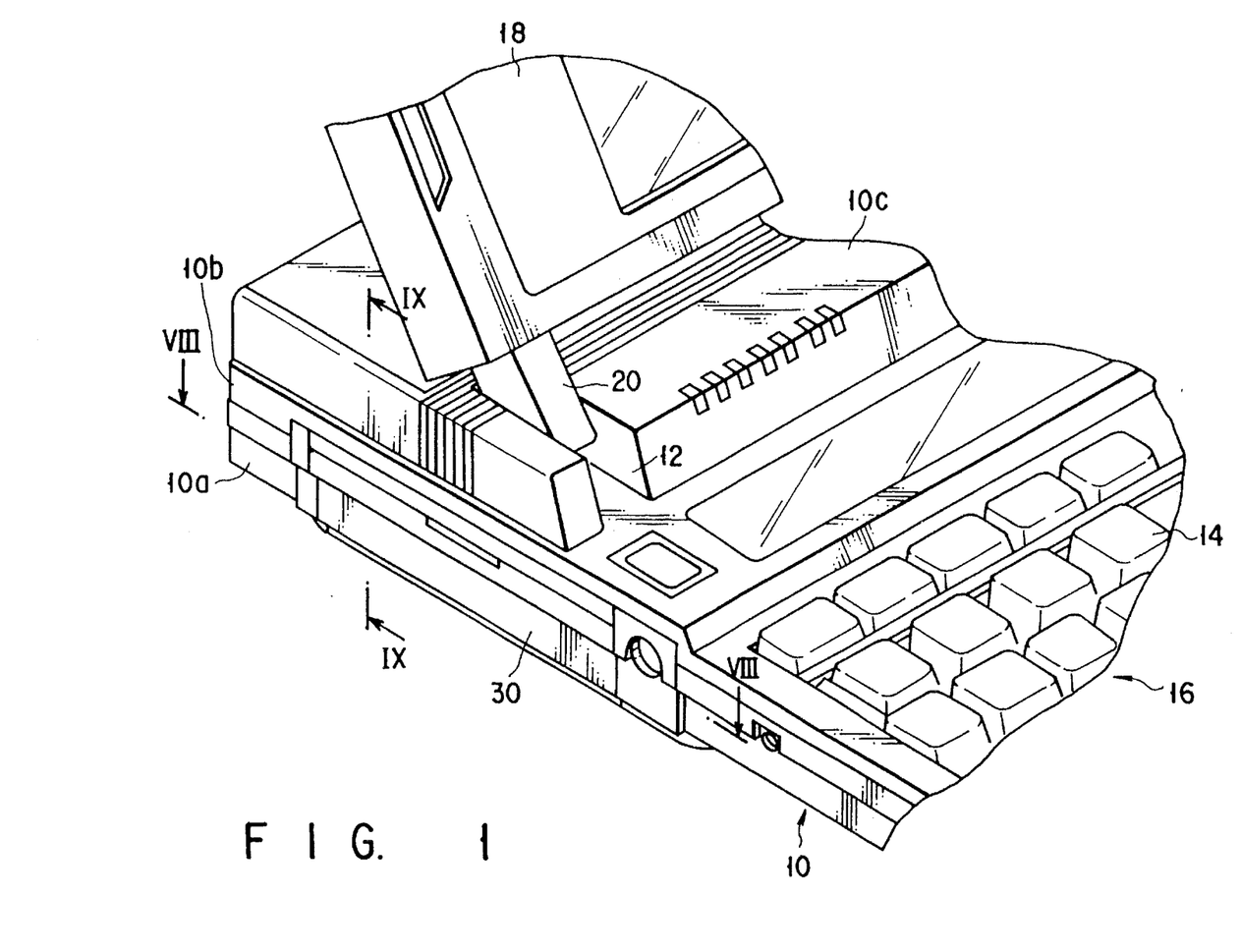
FIG. 1 is a perspective view of a rear portion of the computer, showing a state in which the insertion opening of a HDD-pack-storing portion is closed with a cover panel.

FIG. 1 shows a lap-top type personal computer according to the embodiment of the invention. This computer has a rectangular flat body 10 comprising lower and upper cases 10a and 10b made of a synthetic resin. The upper case 10b has an upper rear projection 10c extending in the width direction. The projection 10c has a pair of depressions 12 (only one of which is shown) formed separate from each other in the width direction of the body 10. At the front portion of the upper case 10b is provided a keyboard 16 having a plurality of keys 14.

A flat rectangular display unit 18 is mounted on the body 10 such that it can be closed and opened. The display unit 18 has a pair of legs 20 (only one of which is shown) projecting from the lower end thereof and serving as pivoting portions. The legs 20 are received in the depressions 12 of the body 10, and rotatably supported on the body 10 by means of hinges (not shown). Accordingly, the display unit 18 can rotate between an open position in which the keyboard 16 is exposed to the outside and a closed position in which the keyboard is covered with the display unit 18.

Figure 2:
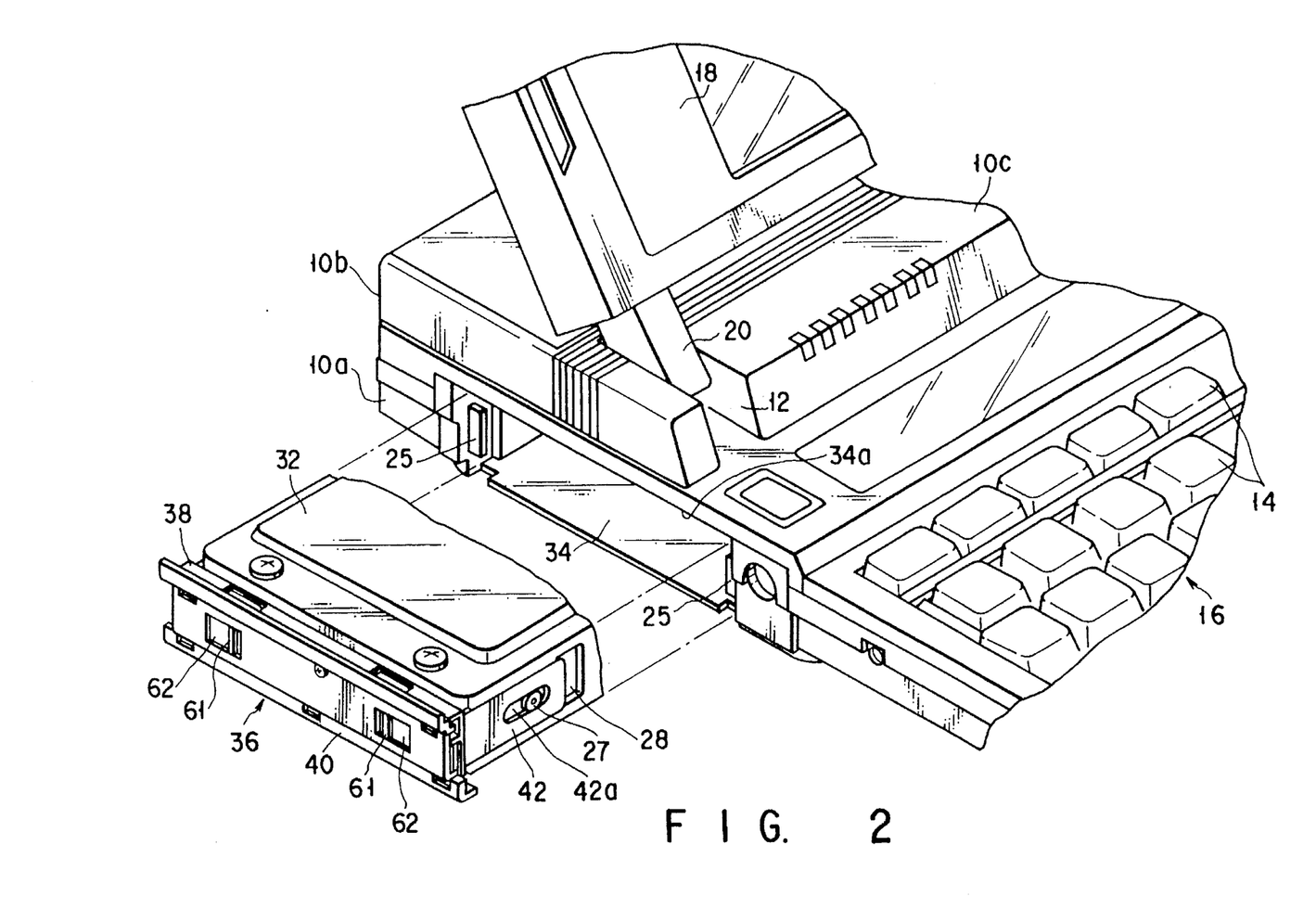
FIG. 2 is a perspective view of the rear portion of the computer, useful in explaining how a HDD pack coupled with a HDD holder main body is inserted into the storing portion.

As is shown in FIGS. 1 and 2, the body 10 has a storing portion 34 formed in a rear portion of the lower case 10a for storing a rectangular hard disk drive (hereinafter called "HDD") pack 32 which serves as a detachable unit in the present invention. The storing portion 34 has a rectangular insertion opening 34a opening in the rear portion of the left side face of the body 10. The HDD pack 32 can be inserted into and taken out of the storing portion 34 through the insertion opening 34a. The insertion and removal of the pack 32 is performed using a HDD holder 36 removably coupled with the HDD pack. As is shown in FIG. 1, the insertion opening 34a of the storing portion 34 is usually closed with a cover plate 30. Further, a pair of projections 25 (see FIGS. 2 and 8) project in the storing portion 34 from two opposite walls of the body 10 defining the storing portion 34, and located in the vicinity of the insertion opening 34a.

As is shown in FIGS. 3 to 6, the HDD holder 36 comprises a substantially rectangular holder main body 38 corresponding to the shape of the insertion opening 34a, and a front plate 40 secured to the front face of the holder main body 38 and having substantially the same shape as the insertion opening 34a. The holder main body 38 has a pair of holding arms 42 extending from the both opposite ends of the body 38 in parallel with each other and being perpendicular to the body 38. The arms 42 are opposed to each other with a distance, substantially equal to the width of the HDD pack 32, interposed therebetween. Each arm 42 has an elongate hole 42a extending in the longitudinal direction thereof. On the both sides of an end portion of the HDD pack 32 are formed engagement grooves 28 for engaging the holding arms 42. A guide roller 27 for engaging the elongate hole 42a of each arm 42 is provided on the bottom of the engagement groove 28.

Figure 3:
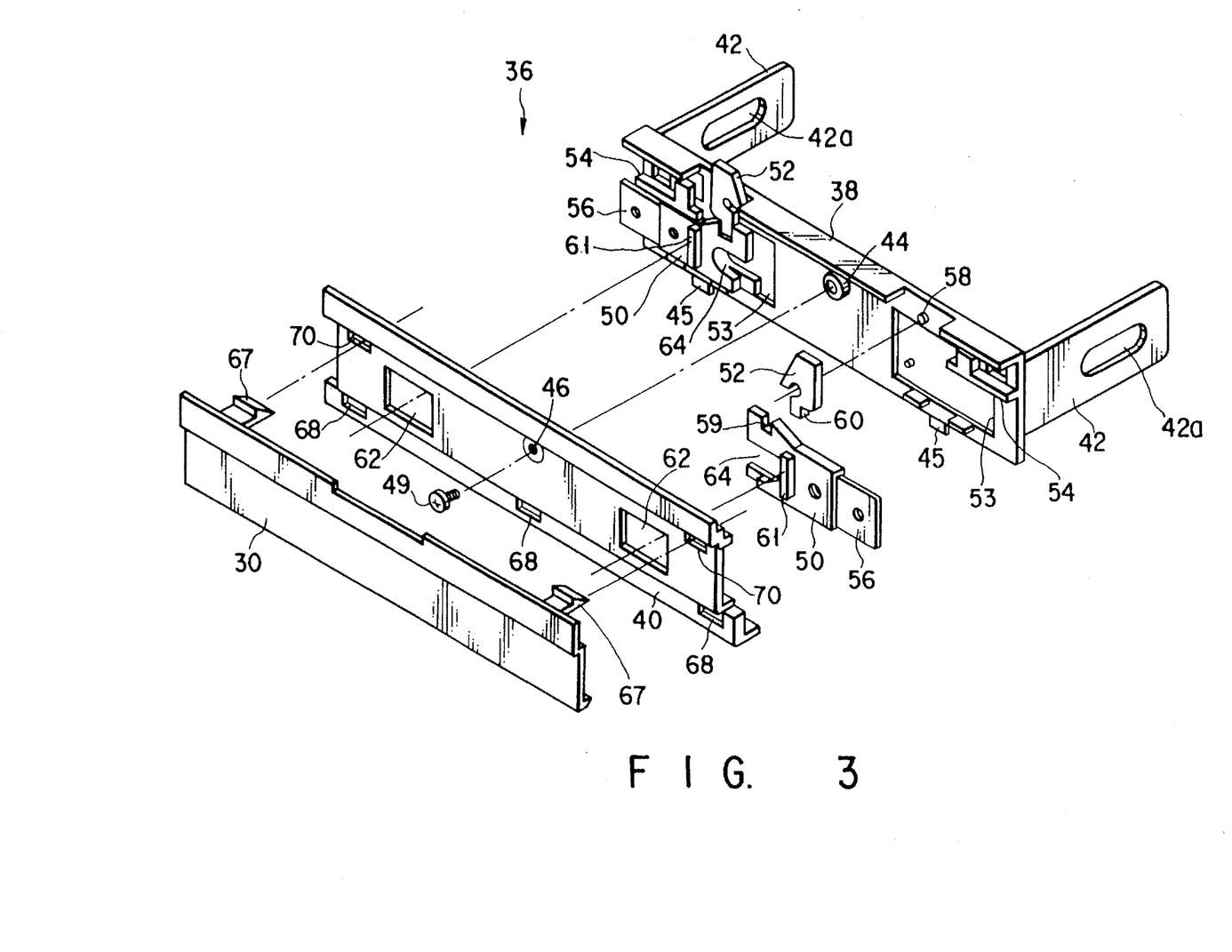
FIG. 3 is an exploded perspective view of the HDD holder.

The holder main body 38 has a pair of through holes 43 formed in its upper opposite end portions, a boss 44 formed in its upper central portion and having a threaded hole, and a pair of projections 45 projecting from its lower end. The front plate 40 has a through hole 46 formed in its upper central portion, a pair of projections (not shown) corresponding to the through holes 43, and a pair of engagement holes (not shown) formed in lower end portions corresponding to the projections 45. The front plate 40 is secured to the main body 38 by means of a screw 49 screwed in the boss 44 through the through hole 43, while its projections being fitted in the through holes 43 and its engagement holes being engaged with the projections 45 of the body 38.

Between the holder main body 38 and the front plate 40, a pair of sliders 50 are slidably provided and a pair of rotatable retaining claws are rotatably provided. Each slider 50 is guided by a guide groove 53 and a guide rib 54 which are formed on the front face of the main body 38, and is slidable in the longitudinal direction of the main body 38, i.e., in a direction parallel with the surface of the upper case 10b. A metal latch claw 56 is secured to each slider 50. Thus, the slider 50 is slidable between a retreat position, shown in FIG. 5, in which the latch claw 56 is retreated between the holder main body 38 and front plate 40, and a latch position (engagement position), shown in FIGS. 3, 4, and 6, in which the latch claw 56 projects from a side edge of the main body 38. The combination of the slider 50 and latch claw 56 serves as the retaining member of the invention.

Figure 4:
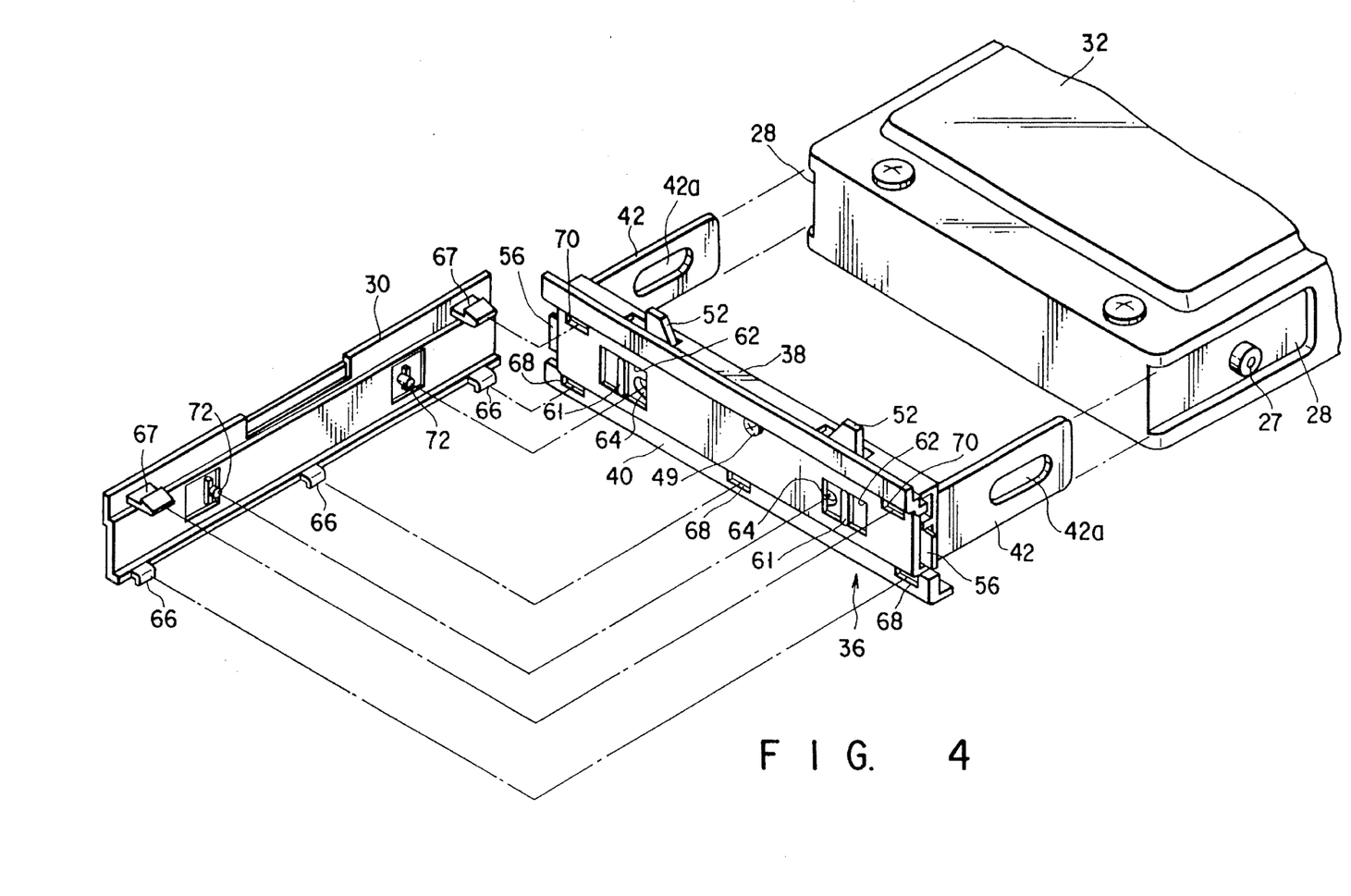
FIG. 4 is a perspective view, showing the main body and cover panel of the HDD holder, and the HDD pack.
Figure 5:
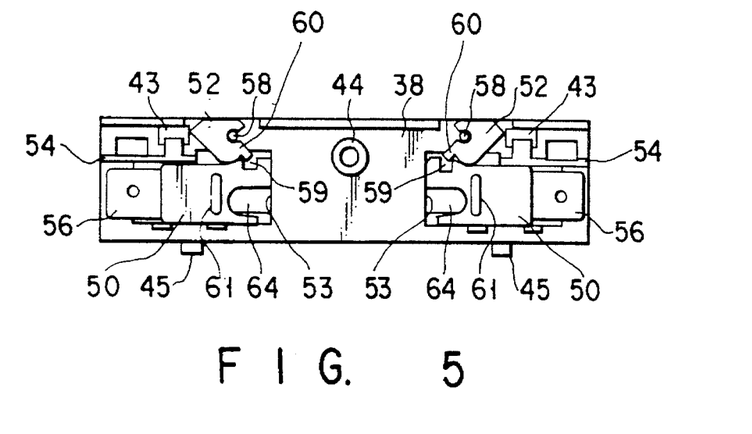
FIG. 5 is a front view of the holder main body, showing a state in which retaining members thereof are in a retreat position.
Figure 6:
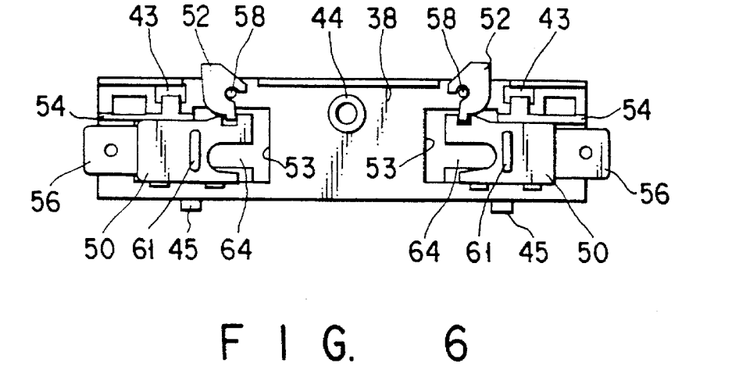
FIG. 6 is a front view of the holder main body, showing a state in which the retaining members are in an engagement position.

A pair of support pins 58 project from those portions of the front surface of the holder main body 38 which are located in the vicinity of the guide grooves 53, respectively. Each retaining claw 52 is rotatably supported by the corresponding pin 58, and located above the corresponding slider 50. Each claw 52 has a projection 60 engaging an engagement groove 59 formed in the corresponding slider 50. Accordingly, the claws 52 can rotate about the pins 58 in interlock with the sliding motion of the sliders 50. Specifically, when the sliders 50 assume their retreat positions as shown in FIG. 5, the claws 52 assume their retreat positions between the holder main body 38 and front plate 40. Then, when the sliders 50 are moved to their latch positions as shown in FIGS. 3, 4, and 6, the claws 52 are rotated to their engagement positions in which they project from the upper end of the holder main body 38.

Each slider 50 has an operable projection 61 projecting into an opening 62 formed in the front plate 40. Accordingly, the sliders 50 can be moved from the front 10 side of the main body 38 by operating the projections 61, respectively. Each slider 50 also has a notch 64 which communicates with the corresponding opening 62 when the slider is in the latch position.

The cover plate 30 for closing the insertion opening 34a of the computer body 10 is attachable to the front plate 40 of the HDD holder 36. Specifically, the plate 30 has three engagement claws 66 projecting from its lower end and a pair of engagement claws 67 projecting from its upper end.

The front plate 40 has three engagement holes 68 corresponding to the engagement claws 66, and a pair of engagement holes 70 corresponding to the engagement claws 67. The cover plate 30 is removably attached to the front face of the front plate 40, with the engagement claws 66 and 67 fitted in the engagement holes 68 and 70, respectively.

The cover plate 30 also has a pair of lock pins 72 projecting from the inner surface toward the HDD holder 36. The lock pins 72 are opposed to the openings 2 in the front plate 40, and serve as lock members for locking the sliders 50, hereinafter referred to.

Insertion of the HDD pack 32 into the storing portion 34 of the computer body 10 is performed in the following manner. Referring first to FIG. 2, the HDD holder 36 is connected to the HDD pack such that one end of the HDD pack 32 is positioned between the holding arms 42, while elastically deforming the arms so as to slightly widening the distance between the holding arms 42. Thus, the guide rollers 32a projecting from the both opposite end faces of the HDD pack 32 are engaged in the long holes 42a in the holding arms 42. In this state, the HDD holder 36 can slightly move relative to the HDD pack 32 in the direction in which the arms 42 extend.

The sliders 50 of the holder 36 are moved to the retreat positions, and accordingly the latch claws 56 and retaining claws 52 are retreated in the holder main body 38.

Figure 7:
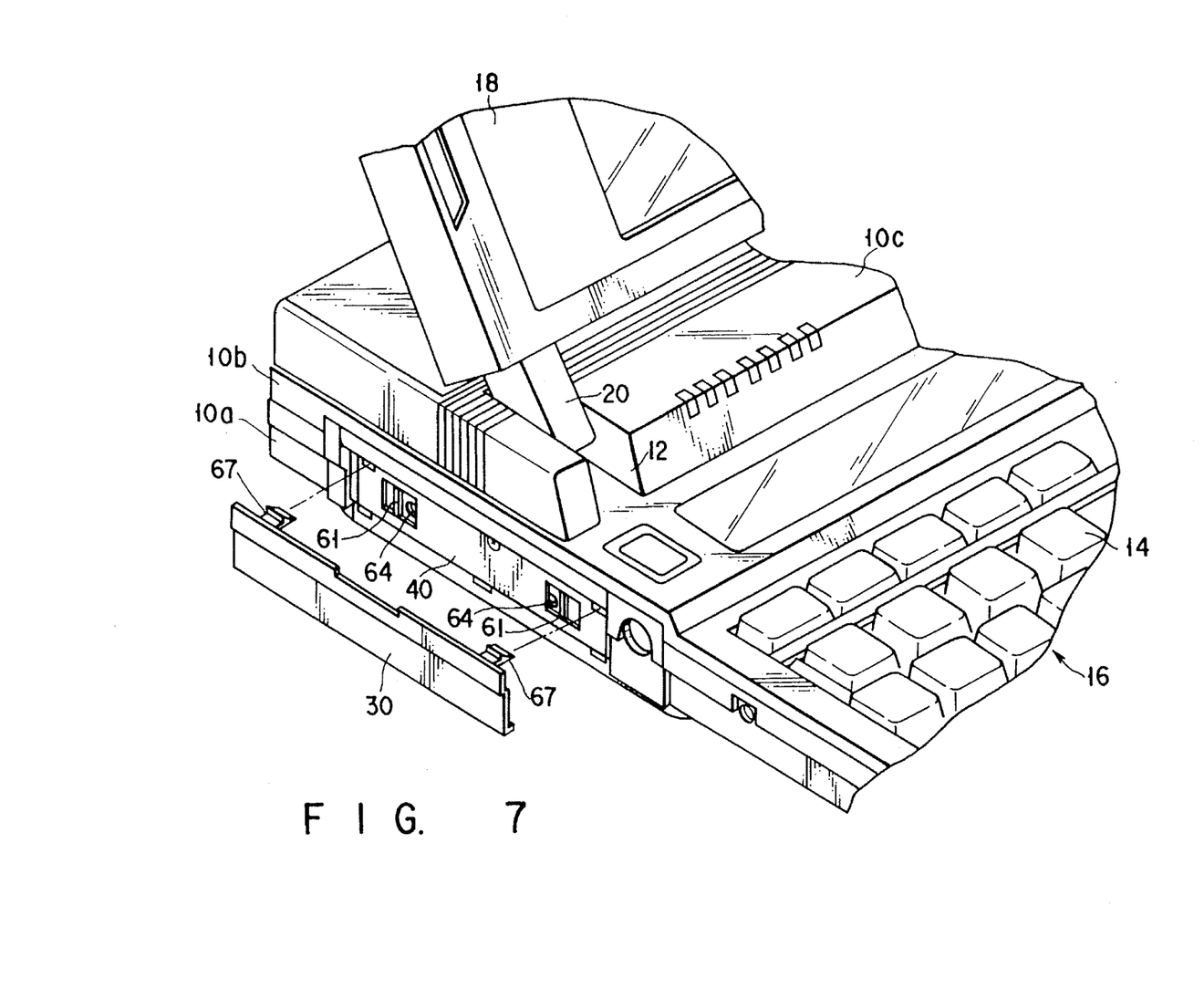
FIG. 7 is a perspective view of the rear portion of the computer, showing a state in which the HDD pack and holder main body are received in the storing portion and insertion opening.
Figure 8:
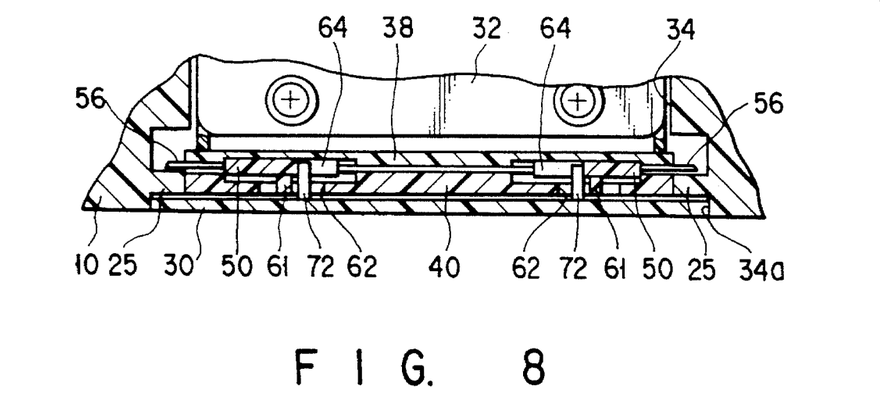
FIG. 8 is a cross sectional view taken along line VIII—VIII in FIG. 1.
Figure 9:
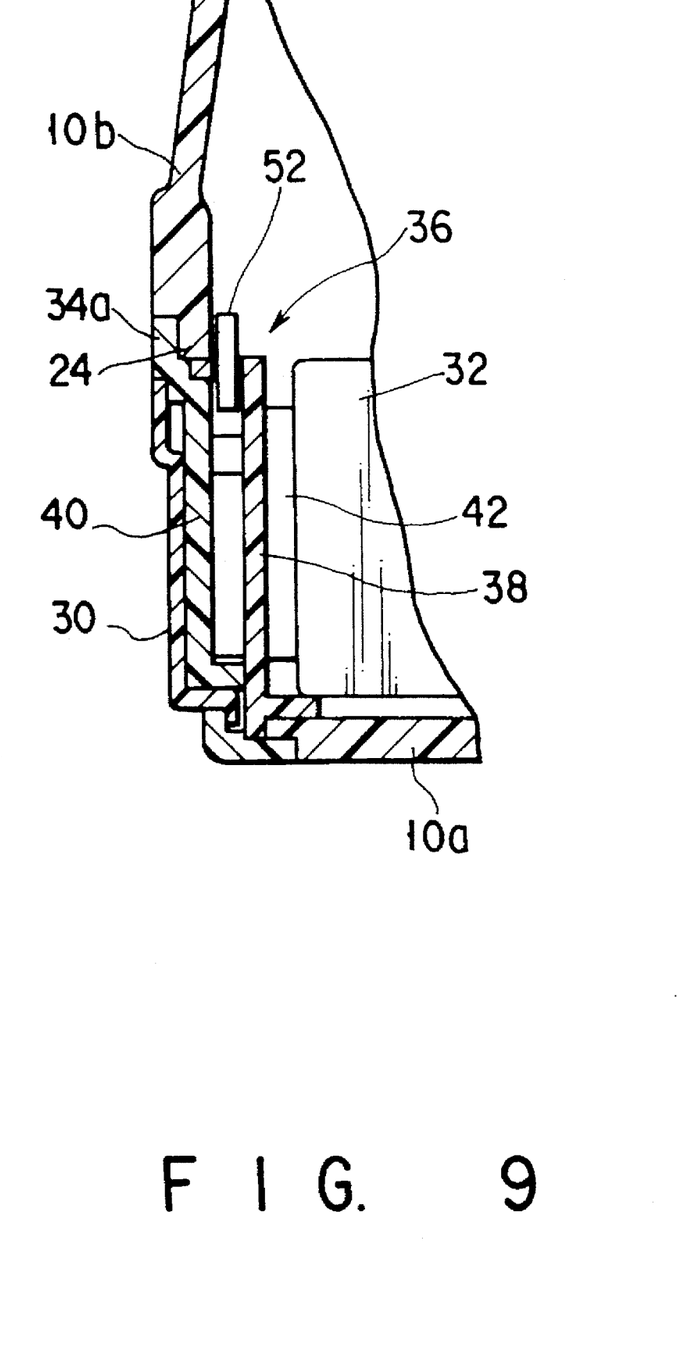
FIG. 9 is a cross sectional view taken along line IX—IX in FIG. 1.

Subsequently, the other end of the pack 32 is inserted into the storing portion 34 through the insertion opening 34a, and the holder 36 is pushed toward the insertion opening 34a. As is shown in FIG. 7, the holder 36 is pushed until the front plate 40 thereof is fitted in the insertion opening 34a, and thereafter the sliders 50 are moved to the latch positions by operating the projections 61. Thus, as is shown in FIG. 8, the latch claws 56 secured to the sliders 50 project from the side edges of the holder main body 38, and are engaged with the projections 25 formed in the computer body 10 and serving as engagement portions. At this time, the retaining claws 52 are rotated to the engagement position as shown in FIG. 9, and engaged with that rib 24 of the computer body 10 which projects from the upper edge of the insertion opening 34a. Thus, the HDD holder 36 is fitted in the insertion opening 34a and the HDD pack 32 is stored in a predetermined position in the storing portion 34.

Thereafter, the cover plate 30 is attached to the front plate 40, thereby closing the insertion opening 24a and forming part of the outer surface of the body 10. As is shown in FIG. 8, the lock pins 72 projecting from the inner surface of the plate 30 are respectively inserted into the notches 64 formed in the sliders 50 through the openings 62 in the front plate 40. Thus, movement of each slider 50 toward the retreat position is restricted, i.e., the slider is locked in the latch position, so that the HDD holder 36 and pack 32 are securely held in predetermined positions, respectively.

where the latch claws 56, retaining claws 52, and hence sliders 50 are in the retreat positions, the notches 64 in the sliders do not communicate with the openings 62 but are covered with the front plate 40. In this state, if the cover plate 30 is tried to be attached to the front plate 40, it cannot be done so since the lock pins 72 of the plate 30 will collide with the sliders 50. Therefore, the sliders 50 must be moved to the latch positions to reliably fit the HDD holder 36 and pack 32 into the computer body 10, before the cover plate 30 is attached to the front plate 40. This being so, such an erroneous operation as of mounting the cover plate 30 on the body 10 without reliably fitting the HDD holder 36 and pack 32 therein is prevented. Accordingly, the pack 32 is prevented, during transfer of the computer, from being unintentionally removed from the body 10 and hence from being injured.

Removal of the pack 32 from the body 10 is performed in the order reverse to the above.

In the personal computer having the above-described structure, the HDD pack 32 can be fixed in the storing portion 34 of the computer body 10 with the use of no screws. Therefore, attachment and detachment of the pack is easily performed without using a tool such as a driver. Also, the holder 36 is locked with the cover plate 30 fitted in the insertion opening 34a of the body 10, so that the HDD pack 32 is reliably kept in a predetermined position in the storing portion 34.

Further, such a structure may be added to the invention that a printed circuit board having an interface for the HDD pack 32 is provided in the computer body 10, that a HDD sensor is provided on the circuit board so as to be turned on or off when the HDD pack is normally stored in the computer body, and that a HDD-driving circuit in the computer is turned off by the HDD sensor before an interface connector in the HDD pack is disconnected from a connector on the side of the circuit board. In this case, the HDD pack can be attached to and detached from the computer in an electrically safe manner.

The present invention is not limited to the above-mentioned embodiment, but may be modified without departing from the scope thereof. For example, the present invention is applicable to another electronic apparatuses such as a word processor.

In addition, the cover plate may have engagement grooves serving as lock portions in place of the lock pins. In this case, each slider has projections to be engaged with the engagement grooves in the latch position.

Further, the detachable unit is not limited to a hard disk drive pack, but a battery pack, for example, may be used as the detachable unit. In this case, the holder main body may be formed integral with a casing of the battery pack.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An electronic apparatus comprising:

a body including a storing portion and an engagement portion;

a detachable trait detachably stored in the storing portion; and a unit holder for holding the detachable unit in the storing portion, the unit holder being slidably connected to the detachable unit and including an engaging member movable between an engaging position wherein the engaging member engages the engagement portion to hold the detachable unit in the storing portion and a release position wherein the engaging member is disengaged from the engagement portion.

2. An electronic apparatus comprising:

a body including an engagement portion and a storing portion which has an insertion opening;

a detachable unit detachably stored in the storing portion through the insertion opening; and a unit holder for holding the detachable unit in the storing portion, the unit holder being slidably connected to the detachable unit and including a main body for covering the insertion opening when the detachable unit is stored in the storing portion, and an engaging member movable between an engaging position wherein the engaging member engages the engagement portion to hold the detachable unit in the storing portion and a release position wherein the engaging member is disengaged from the engagement portion.

3. An electronic apparatus according to claim 2, wherein the unit holder includes a pair of arms extending from the main body and slidably fitted to the detachable unit so that the unit holder is slidable between a holding portion wherein the main body is fitted in the insertion opening and a drawn position wherein the main body projects from the body to serve as a handle for drawing for detachable unit from the storing portion.

4. An electronic apparatus according to claim 2, wherein the unit holder is slidably connected to the detachable unit such that the detachable unit is slidable in an insertion direction of the detachable unit into the storing portion through the insertion opening and in an extraction direction of the detachable unit out of the storing portion through the insertion opening.

5. An electrode apparatus comprising:

a body including a storing portion and an engagement portion;

a detachable unit detachably stored in the storing portion; and a unit holder for holding the detachable unit in the storing portion, the unit holder being connected to the detachable unit to be slidable between a holding position wherein the holding unit holds the detachable unit in the storing portion and a drawn position wherein the unit holder projects from the body so as to serve as a handle for drawing the detachable unit from the storing portion, and the unit holder including an engaging member movable between an engaging position whereto the engaging member engages the engagement portion to hold the unit holder in the holding position and a release position wherein the engaging member is disengaged from the engagement portion.

6. An electronic apparatus according to claim 5, wherein the storing portion has an insertion opening which is open to an outer surface of the body and through which the detachable unit is to be detached from the storing portion, and the unit holder has a main body for covering the insertion opening, and a pair of arms extending from the main body and slidably connected to the detachable unit.

7. An electronic apparatus according to claim 6, wherein each of the arms has a elongated hole, and the detachable unit has a pair of guide members slidably fitted in the elongated holes, relatively.

8. An electronic apparatus according to claim 6, wherein the engaging member is movably provided on the main body.

* * * * *